(12) United States Patent
Hendricks et al.

(10) Patent No.: US 11,105,491 B2
(45) Date of Patent: Aug. 31, 2021

(54) LIGHT-PRODUCING ASSEMBLY FOR A SPOTLIGHT AND SPOTLIGHT

(71) Applicant: ARNOLD & RICHTER CINE TECHNIK GMBH & CO. BETRIEBS KG, Munich (DE)

(72) Inventors: Frank Hendricks, Bad Waldsee (DE); Volker Schumacher, Bad Waldsee (DE); Erwin Melzner, Frasdorf (DE)

(73) Assignee: ARNOLD & RICHTER CINE TECHNIK GMBH & CO. BETRIEBS KG, Munich (DE)

( * ) Notice: Subject to any disclaimer, the term of this patent is extended or adjusted under 35 U.S.C. 154(b) by 0 days.

(21) Appl. No.: 16/442,465

(22) Filed: Jun. 15, 2019

(65) Prior Publication Data
US 2019/0383470 A1    Dec. 19, 2019

(30) Foreign Application Priority Data
Jun. 15, 2018  (EP) ................................... 18178043

(51) Int. Cl.
*F21V 14/06* (2006.01)
*F21S 10/02* (2006.01)
(Continued)

(52) U.S. Cl.
CPC ............ *F21V 14/065* (2013.01); *F21S 10/02* (2013.01); *F21V 5/006* (2013.01); *F21V 19/003* (2013.01);
(Continued)

(58) Field of Classification Search
CPC ...... F21V 14/065; F21V 5/006; F21V 19/003; F21S 10/02; H01L 33/60
(Continued)

(56) References Cited

U.S. PATENT DOCUMENTS

| 6,340,868 B1 * | 1/2002 | Lys ....................... G09G 3/2014 |
| | | 315/185 S |
| 6,528,954 B1 * | 3/2003 | Lys ....................... A61N 5/0616 |
| | | 315/158 |

(Continued)

FOREIGN PATENT DOCUMENTS

| WO | 2012/140589 A2 | 10/2012 |
| WO | 2012/140589 A3 | 10/2012 |
| WO | 2018/104146 A1 | 6/2018 |

OTHER PUBLICATIONS

EP Office Action in application No. 18178043.8 dated Dec. 21, 2018.
(Continued)

*Primary Examiner* — Bryon T Gyllstrom
(74) *Attorney, Agent, or Firm* — Maschoff Brennan

(57) ABSTRACT

A light-producing assembly for a spotlight for illuminating film, studio, stage, event and/or theater surroundings comprises a carrier, on which an LED arrangement with a multiplicity of LEDs is arranged. Here, the LEDs are provided by N>2 different color types. The assembly also comprises a line system for supplying power to the LEDs, which comprises a multiplicity of lines with N line types, wherein lines of different line types cross in crossing regions and the crossing regions lie outside of a vertical projection surface of footprint sides of the LEDs in a vertical plan view of the carrier front side. Further, the assembly comprises an optical unit coupled to the LED arrangement, said optical unit spanning the totality of the LEDs. Moreover, a spotlight comprises such a light-producing assembly.

16 Claims, 4 Drawing Sheets

(51) Int. Cl.
*F21V 5/00* (2018.01)
*F21V 19/00* (2006.01)
*H01L 33/60* (2010.01)
*F21W 131/406* (2006.01)

(52) U.S. Cl.
CPC ....... *H01L 33/60* (2013.01); *F21W 2131/406* (2013.01)

(58) Field of Classification Search
USPC ......................................................... 362/257
See application file for complete search history.

(56) References Cited

U.S. PATENT DOCUMENTS

| | | | | |
|---|---|---|---|---|
| 7,204,607 | B2* | 4/2007 | Yano | F21K 9/00 352/235 |
| 7,830,356 | B2* | 11/2010 | Lee | G09G 3/3426 345/102 |
| 9,341,362 | B2* | 5/2016 | Holmes | F21V 5/045 |
| 10,451,224 | B2* | 10/2019 | Van De Ven | F21K 9/238 |
| 2003/0189829 | A1* | 10/2003 | Shimizu | F21L 4/00 362/240 |
| 2008/0244944 | A1* | 10/2008 | Nall | G09F 13/04 40/544 |
| 2011/0182054 | A1* | 7/2011 | Lee | H05K 1/0203 362/84 |
| 2011/0211351 | A1* | 9/2011 | Van De Ven | F21K 9/238 362/249.02 |
| 2011/0254022 | A1* | 10/2011 | Sasano | H01L 33/32 257/88 |
| 2012/0262076 | A1 | 10/2012 | Briggs | |
| 2013/0155671 | A1* | 6/2013 | Kurt | F21K 9/00 362/231 |
| 2014/0022780 | A1* | 1/2014 | Roberge | F21K 9/00 362/231 |
| 2015/0308671 | A1* | 10/2015 | Tischler | H01S 5/042 362/235 |
| 2015/0330610 | A1* | 11/2015 | Song | F21V 25/12 362/6 |
| 2018/0286841 | A1* | 10/2018 | Makanoeich | H01L 33/62 |

OTHER PUBLICATIONS

EP Search Report in Application No. 19 179 742.2 dated Oct. 17, 2019.

EP Office Action in Application No. 19 179 742.2 dated Jan. 29, 2021.

* cited by examiner

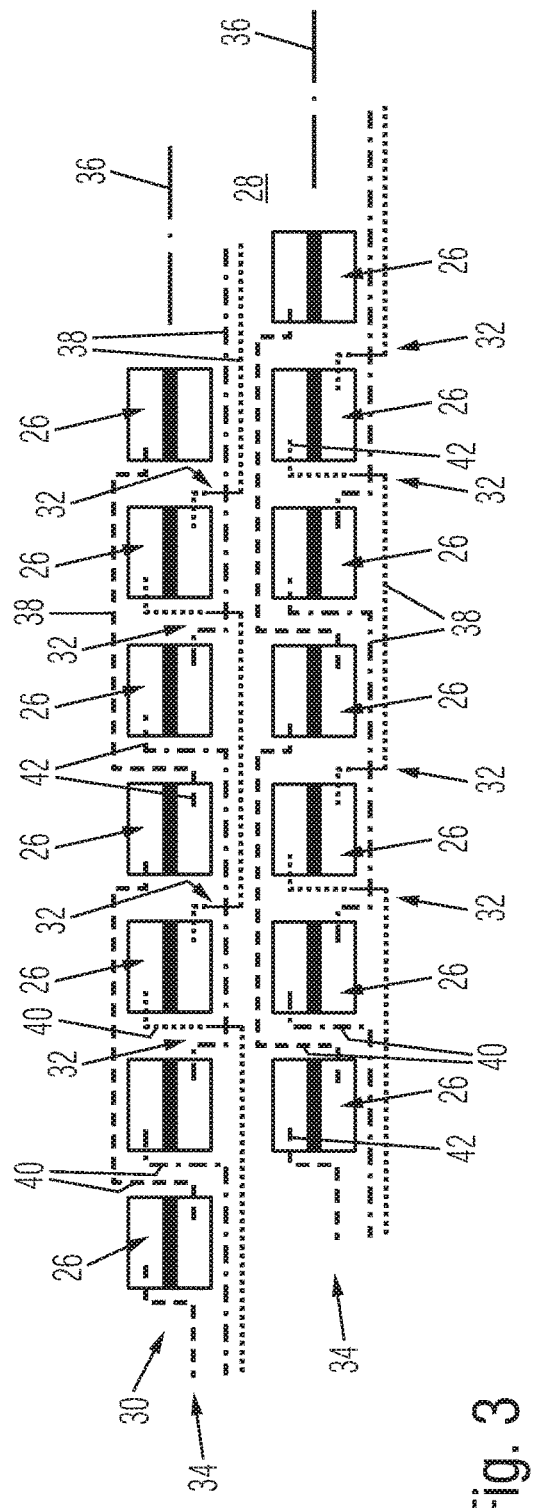
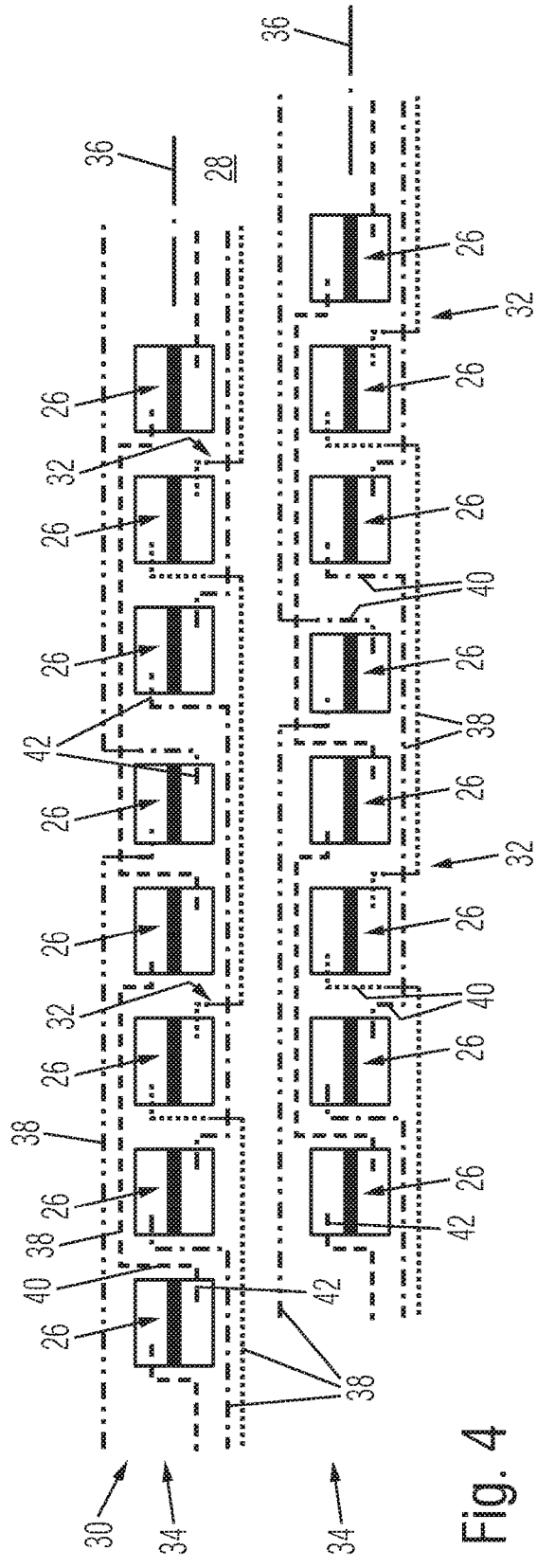

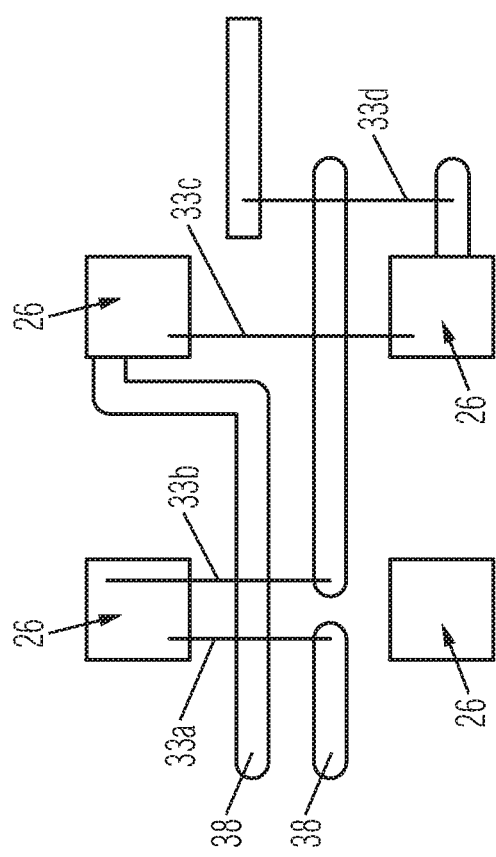
Fig. 6
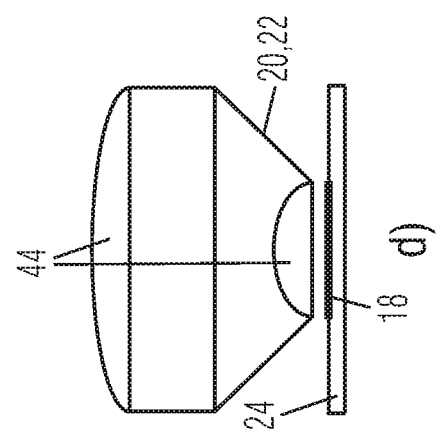
d)
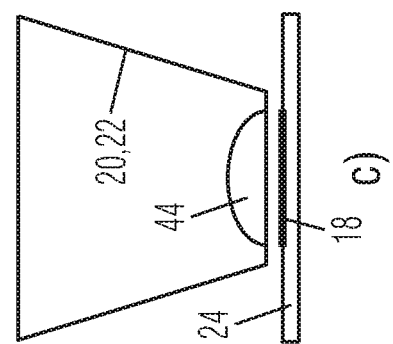
c)
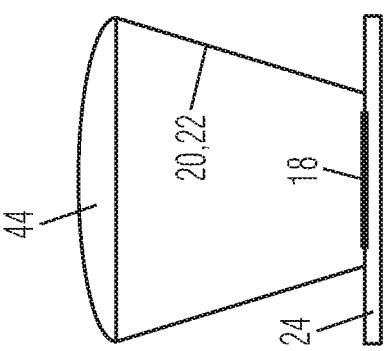
b)
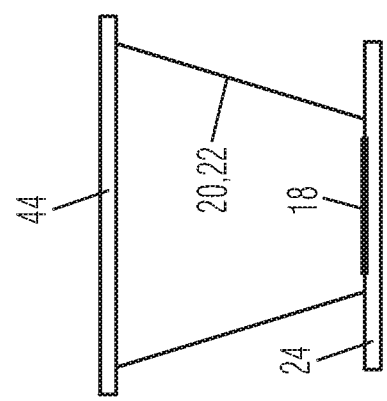
a)
Fig. 7

LIGHT-PRODUCING ASSEMBLY FOR A SPOTLIGHT AND SPOTLIGHT

The present patent application claims priority of European patent application EP 18 178 043.8 filed on Jun. 15, 2018, wherein the content of this European patent application is incorporated herein in its entirety.

TECHNICAL FIELD

The present specification relates to embodiments of a light-producing assembly for a spotlight for illuminating film, studio, stage, event and/or theater surroundings. In particular, the present specification relates to a light-producing assembly with a certain LED arrangement. Further, the present specification relates to embodiments of a spotlight for illuminating film, studio, stage, event and/or theater surroundings.

BACKGROUND

Spotlights are usually used for illuminating film, studio, stage, event and/or theater surroundings. Sometimes, it is desirable for a spotlight comprising a light-producing assembly to provide a sufficient luminous flux and satisfy further requirements, as are conventional for film, studio, stage, event and/or theater surroundings. By way of example, such requirements comprise continuous operation over several hours, a broad adjustment range for an emission angle, a homogeneous light field and/or a light field that peters out softly. These functions must be reliably provided, even under difficult ambient surroundings and great load on the spotlight.

Instead of conventional light sources, such as for example incandescent lamps or gas-discharge lamps, use is increasingly made of light-producing assemblies with an LED arrangement. Here, a plurality of LEDs can be arranged on a carrier and the light produced by these LEDs can be processed further in optical fashion in order to provide a spotlight with certain properties.

It is usually desirable to build a very compact light source that is adjustable in terms of color. This sometimes requires LEDs to be arranged tightly adjacently to one another. However, a high packaging density may require a complicated implementation of a power supply as LEDs of different color types have to be supplied with different operating currents at different positions. The high temperatures possibly further accompanying this on account of the power loss may require the use of thermally well conducting substrates; however, this may lead to restrictions in relation to the design and layout of the power lines. Thus, packaging density, cooling and a good color mixture sometimes act against one another. An additional problem is that, particularly in the case of relatively compact light-producing assemblies, high requirements should be placed on the geometric precision of the optical units that process further the light emanating from the LEDs. Specifically, it is important that the individual lenses are positioned exactly over the respectively assigned LEDs, particularly in the case of so-called lens arrays. On account of the high temperatures in compact light-producing assemblies, it may additionally be necessary to produce the optical units from glass instead of from plastics. This requires a complicated and comparatively expensive production.

It is therefore an object of the present specification to propose a light-producing assembly and a spotlight equipped therewith, in which the aforementioned target conflict is resolved or at least moderated. Thus, in particular, the intention is to specify a light-producing assembly which is able to provide a well-mixed light in terms of color and, in the process, is particularly compact. At the same time, the assembly should be producible in a simple and cost-effective manner. The same applies to a spotlight equipped therewith.

SUMMARY

The object is achieved by a light-producing assembly, comprising
- a carrier, on which an LED arrangement with a multiplicity of LEDs is arranged, wherein the LEDs comprise LEDs with N>2 different color types and any number of LEDs is provided for each of the N color types, and wherein a footprint side of one of each of the LEDs faces a carrier front side;
- a line system for supplying power to the LEDs, comprising a multiplicity of lines with N line types, wherein lines of different line types cross in crossing regions and the crossing regions lie outside of a vertical projection surface of the footprint sides on the carrier front side in a vertical plan view of the carrier front side; and
- an optical unit coupled to the LED arrangement, said optical unit spanning the totality of the LEDs and being embodied to receive and form the light emanating from each of the LEDs.

Further, the object is achieved by a light-producing assembly, comprising
- a carrier, on which an LED arrangement with a multiplicity of LEDs is arranged, wherein the LEDs comprise LEDs with N>2 different color types and any number of LEDs is provided for each of the N color types;
- a line system for supplying power to the LEDs, comprising a multiplicity of lines with N line types; and
- an optical unit coupled to the LED arrangement, said optical unit spanning the totality of the LEDs and being embodied to receive and form the light emanating from each of the LEDs,
- wherein the carrier has, at least in sections, a multi-layer design in respect of the lines of the line system and lines of different line types form crossing regions, in which the lines cross, in this multilayer region; and
- wherein the carrier has a single layer design in respect of the lines in the region of a vertical projection surface of the LEDs on the carrier.

Such light-producing assemblies can also be referred to as an LED light source or as a light engine. Good thermal conduction between the LEDs and the carrier is ensured as a result of the crossing regions lying outside of the vertical projection surfaces of the footprint sides (e.g., solder side) and/or the carrier having a single layer design in this region. Expressed differently, the LEDs can be reliably cooled. This facilitates a particularly compact design of the light-producing assembly. By means of the N line types, the LEDs of the N color types can be switched, color type by color type, in individual fashion or in any combinations. The light-producing assembly can thus provide light corresponding to the N color types and the combinations thereof. In the case where a combination is switched, the light emitted by the light-producing assembly is moreover mixed particularly well. By virtue of crossing regions being provided for lines of different types, the LEDs can be arranged on the carrier as desired. This, too, promotes good light mixing.

By way of example, the LEDs are so-called lens-free LEDs. Apart from the optical components strictly necessary for light production and emission, for example, the LEDs have no further optical components, which only serve to shape or otherwise influence the emitted light. Such lens-free LEDs have a comparatively simple design and are commercially available in cost-effective fashion. Moreover, they have compact dimensions.

By way of example, the assembly is lens-array-free. This means that the light-producing assembly has no lens array. Since a lens array for an LED arrangement comprises a multiplicity of individual lenses (e.g., exactly one for each LED), which must be very small within the sense of a compact light-producing assembly, the smallest still producible dimensions of the lenses of such a lens array limit the installation size of the light-producing assembly in the direction of a more compact design. Firstly, this is implemented from technical points of view since lenses with the desired optical properties are no longer producible below a certain minimum dimension. Secondly, the limitation is also from economic points of view since higher production costs may arise for smaller lens arrays, for example because there needs to be complex post-processing of the lenses. Consequently, new degrees of freedom are opened up in the design of the light-producing assembly by the omission of the lens array; in particular, a particularly compact design of the light-producing assembly or parts thereof is facilitated.

By way of example, the carrier is a circuit board. Circuit boards have proven their worth as carriers for applications such as light-producing assemblies. Moreover, they require manufacturing steps for the light-producing assembly, which can be controlled well and which can be carried out by means of standard machines and installations. Thus, a light-producing assembly in which the carrier is a circuit board can be produced in a simple and cost-effective manner.

The carrier is embodied as a ceramic carrier according to one embodiment. Furthermore, the carrier can be embodied as, for example, an entirely single layer circuit board (without multi-layer sections).

The crossing lines can extend one above the other in a direction vertical to the carrier front side, wherein the crossing lines may be integrated into the carrier in the crossing region. Alternatively, one of the crossing lines can be embodied as a bonding bridge which, for example, extends above the carrier. Thus, there are two alternatives for realizing crossing lines. In the case of a bonding bridge, one of the lines comprises a wire section in the crossing region, said wire section extending above or below the other line. This is a reliable technique for realizing line crossings, which has proven its worth. As an alternative thereto, both crossing lines can be integrated into the carrier. This means that the carrier may have a multi-layer embodiment, at least in the crossing region. This technique, too, has proven its worth. Here, comparatively small, i.e., compact, crossing regions can be realized by means of the lines integrated into the carrier.

In the case where one of the crossing lines is embodied as a bonding bridge, this bonding bridge may also extend directly from one of the LEDs, i.e., from an electrode of the LED, to a conductor track, wherein one or more conductor tracks, or else LEDs, may be bridged. It is likewise conceivable for the bonding bridge to extend from an edge or corner of an LED to a conductor track located at the opposite edge or corner. Thus, the LED is bridged. Additionally, a bonding bridge may extend from one of the LEDs to another of the LEDs.

In one embodiment, all LEDs are arranged according to a regular grid on the carrier front side, according to which:

a multiplicity of grid tracks that do not overlap and that are arranged at a transverse distance from one another are provided on the carrier front side;

each grid track comprises a multiplicity of grid holding areas, an LED being positionable therein in each case, wherein the grid holding areas are arranged individually in succession along a fictitious trajectory from the grid track entrance to the grid track exit; and at least one LED of each of the N different color types is provided in each of at least 90% of all grid tracks, wherein the LEDs are arranged in any sequence within the grid tracks.

The LEDs are arrangeable as desired, both within the at least 90% of the grid tracks and also within the LED arrangement as a whole, for example. This ensures good color mixing. Moreover, this therefore ensures that light-producing assemblies for very different requirements and applications can be provided, in which there are no restrictions at all in respect of the color types of the LEDs.

As stated previously, the carrier can be embodied as a ceramic carrier.

By way of example, the line system comprises conductor tracks. According to one embodiment, the conductor tracks are at least partly incorporated into the carrier and/or partly applied to the carrier. Thus, the line system is at least partly integrated into the carrier according to one embodiment. According to another embodiment, the conductor tracks of the line system can be exclusively applied to the carrier. By way of example, the conductor tracks are at least partly laminated onto the carrier.

According to one embodiment of the light-producing assembly, the carrier is embodied as a ceramic carrier and the line system comprises the multiplicity of lines embodied as conductor tracks for the purposes of supplying power to the LEDs, said lines being laminated onto the ceramic carrier or fastened to the ceramic carrier in any other way.

According to one embodiment of the light-producing assembly, the carrier is embodied as a circuit board (e.g., as a PCB circuit board) and the line system comprises the multiplicity of lines embodied as conductor tracks for the purposes of supplying power to the LEDs, said lines being at least partly incorporated into the circuit board or fastened to the circuit board in any other way. By way of example, the carrier is embodied as a single layer circuit board.

According to one embodiment, the line system comprises main conductor tracks, which extend along the fictitious trajectory of the grid track and which do not overlap among themselves and with the grid tracks, wherein no more than N main conductor tracks are present between two adjacent grid tracks, and the main conductor tracks are each assigned to different color types. Thus, in such an arrangement of the main conductor tracks, main conductor tracks, which are assigned to all available color types, extend in each interstice between two grid tracks. Thus, LEDs of N different color types, which are arranged on the carrier as desired, can be supplied by way of the line system.

Additionally, the line system may comprise main conductor tracks, which extend along the fictitious trajectory of the grid track and which do not overlap among themselves and with the grid tracks, wherein no more than 0.5×N main conductor tracks are present between two adjacent grid tracks (where 0.5×N is rounded up to the next-highest integer should N be odd), and the main conductor tracks that are adjacent on both sides in a direction transverse to the fictitious trajectory of a grid track are each assigned to different color types. Thus, the main conductor tracks between a grid track and a grid track adjacent thereto on a first side are assigned to different color types than the main conductor tracks between the grid track and a grid track adjacent thereto on a second side opposite the first. Consequently, only two main conductor tracks, which are each assigned to different color types, extend in each interstice in the case of four color types. Thus, for example, a main conductor track assigned to the color type red and a main conductor track assigned to the color type yellow extend on the first side. A main conductor track assigned to the color type white and a main conductor track assigned to the color type green extend on the second side. Thus, in the case of a total of four color types, only main conductor tracks assigned to two color types extend in each interstice. Expressed differently, the aforementioned grid tracks are spaced apart from one another by 0.5×N main conductor track widths if the distances between the main conductor tracks and between the main conductor tracks and the grid tracks are ignored. Thus, this yields a particularly compact design of the light-producing assembly.

In one variant, N=4 color types are provided and respectively two main conductor tracks are present between two adjacent grid tracks, wherein the main conductor tracks which are adjacent on both sides in a direction transverse to the fictitious trajectory of a grid track are each assigned to different color types. The already specified advantages and effects emerge analogously.

By way of example, the main conductor tracks extend without crossing. The main conductor tracks can consequently be arranged in a particularly simple fashion on the carrier. This ensures a simple and cost-effective producibility of the light-producing assembly.

A design alternative provides for each of the LEDs to be electrically connected, by means of two connection tracks, to the main conductor track that is assigned in relation to the color type, in a direction transverse to the trajectory of the grid track. According to one embodiment, the LEDs can be supplied with power by way of such connection tracks.

Here, no more than two connection tracks may extend between two grid holding areas of a grid track that are adjacent along the trajectory, wherein each connection track has assigned to it the color type that corresponds to the LED adjoining the latter along the trajectory. Along the trajectory, two adjacent grid holding areas are thus only spaced apart by that width (independently of the number of color types within the trajectory) that is necessary for two connection tracks. Thus, the individual grid holding areas are arranged comparatively densely to one another in the direction of the trajectories, as a result of which a compact design of the light-producing assembly arises.

The connection tracks can each be electrically connected to a contact section of the assigned LED and the contact sections may extend along the trajectory.

Further, each of the crossing regions can be formed by a connection track and a main conductor track, which are assigned to different color types, wherein the main conductor track forming the crossing region is arranged adjacent to a main conductor track to which the connection track forming the crossing region is electrically connected. Expressed differently, the connection tracks thus cross over or under the main conductor track that lies between the main conductor track to be connected to the connection track and the contact section belonging to the connection track. Preferably, each connection track only crosses over or under a single main conductor track in the process. As a result, the design of an associated light-producing assembly is compact.

By way of example, the optical unit is embodied as a conical or polygonal reflector, e.g., as a reflector with a hexagonal cross-sectional area. The reflector can be either round or ellipsoid or polygonal on its light entry side and/or outer side, for example. The light entry side and emergence side may have different diameters (perimeters), and hence a reflector in the form of a truncated cone or a truncated pyramid may arise, for example.

In one embodiment, the optical unit is a singular collimation optical unit. In contrast to a lens array, which comprises a multiplicity of lenses, provision according to the specification is thus only made for a single collimation optical unit. Consequently, a singular collimation optical unit is not understood to mean a lens array, in particular. Here, a singular collimation optical unit represents substantially a single component, as a result of which the design of the light-producing assembly is simple. Moreover, a singular collimation optical unit offers the advantage that it need not be matched to individual LEDs. As a result, manufacturing related restrictions, e.g., minimally possible radii or lengths, as are present in the case of lens arrays, inter alia, are effectively circumvented. Thus, a singular collimation optical unit also contributes to a compact design of the light-producing assembly.

The singular collimation optical unit may be a collimation lens.

According to another variant, the collimation optical unit is a collimation reflector, which has a light entry opening and a light emergence opening, which are connected by way of a turbular light-guiding section, wherein an inner side of the light-guiding section is reflective. In this context, two variants are conceivable. According to a first variant, the light emergence opening covers a larger area than the light entry opening. Thus, the collimation reflector widens in the light emission direction. By way of example, the collimation reflector can be produced from a sheet, in particular a so-called MIRO sheet, or from plastic. In the case of a collimation reflector being made from plastic, the latter is preferably an injection molded part with a highly reflective coating on the inner side. Such a collimation reflector has three optical effects. Firstly, it mixes the light emanating from LEDs of different color types in a reliable and effective manner. Thus, the light that is well mixed in terms of color is provided by the light-producing assembly, even though the individual LEDs can be positioned on the carrier as desired. Secondly, the light rays emanating from the LEDs are focused by the collimation reflector. Hence, the emission angle of the LED arrangement is reduced. Furthermore, the light emerging laterally from the LEDs is collected, mixed in terms of color and focused such that a high light yield emerges if the entry opening of the reflector is situated on or near the circuit board surface (carrier front side). In a second variant, the light emergence opening and the light entry opening cover areas of substantially the same size. The light-guiding section and the collimation reflector overall can be referred to as straight in this variant. By way of example, it may be assembled from mirror glass strips. Alternatively, it can be produced in the same way as the collimation reflector according to the first variant. Reliable mixing of the light of different colors emanating from the LEDs can also be achieved using such a collimation reflector. If the collimation reflector according to the second variant laterally encloses the LEDs, it also provides a light collection functionality. Such a straight collimation reflector may be equipped with a lens or a lens system for the purposes of focusing the light.

Moreover, a protective apparatus, in particular a protective glass, may be provided on the light emergence side of the collimation reflector. Such a protective apparatus prevents unwanted particles, liquids and/or gases from penetrating into the interior of the light-producing assembly. In particular, the particles, liquids and/or gases are prevented from entering into the region of the LEDs and/or the carrier and/or the bond wires. Consequently, a light-producing assembly is created, which is robust against environmental influences and consequently ensures reliable operation.

By way of example, the protective glass has an antireflection coating, i.e. it is provided with a coating on one or both sides, said coating improving the transmission and hence minimizing the interface losses.

Lenses or diffusion screens may also be used as a protective apparatus as an alternative or in addition to the protective glass. In this context, a lens, for example, may be provided on the light entry side or the light emergence side of the collimation reflector. Likewise, combinations of lenses are employable as a protective apparatus. By way of example, a converging lens may be arranged at the light entry side of the collimation reflector and an achromatic converging lens may be arranged at the light emergence side.

According to one embodiment, the optical unit is embodied as a conical or polygonal reflector, e.g., as a reflector with a hexagonal cross-sectional area, and the protective apparatus acting as a diffuser, e.g., as a stochastic or holographic diffuser, is provided at the light emergence side of the optical unit. In this embodiment, too, the carrier can be embodied as a single layer circuit board.

In a plan view of the carrier front side, an envelope of the multiplicity of LEDs can be a closed polygonal chain, a circle or an oval and an edge region of the light entry opening can correspond to the envelope in respect of its form and its size. Here, the polygonal chain is, in particular, a quadrilateral, preferably a rectangle, a pentagon, a hexagon or an octagon. Here, the edge region of the light entry opening is placed on the carrier in such a way that, in the assembled state of the light-producing assembly, it surrounds the LEDs. Consequently, this ensures that the light emitted by the LEDs is introduced into the collimation reflector substantially without losses. Moreover, such a design is particularly compact.

Thus, the collimation reflector can be embodied as a polygonal-folded reflector. Additionally, a collimation reflector with a polygonal light entry opening that merges into a circular or ellipsoid light emergence opening, or vice versa, is conceivable. Likewise, use can be made of collimation reflectors in which both the light entry opening and the light emergence opening are polygonal, albeit with a different number of corners. Further, use can be made of a frustum-shaped collimation reflector.

Moreover, alternatives to the collimation reflector and the collimation lens comprise so-called light mixing units, which may comprise mirrored hollow cylinders, hollow cylinders with a white inner surface and glass or plastic cylinders with a round or polygonal lateral surface and a plain or structured light entry and light emergence surface. So-called diffusers or scattering screens are also conceivable.

Preferably, 4 to 16, in particular 6 to 12, LEDs are present per $cm^2$ within the envelope on the carrier front side. Thus, the LEDs have a relatively high packaging density, particularly in comparison with known light-producing assemblies. This ensures a compact design of the light-producing assembly.

Additionally, the object is achieved by a spotlight of the type set forth at the outset, comprising a light-producing assembly according to the specification. Such a spotlight is compact in its design and producible in a simple and cost-effective manner. Additionally, it provides well-mixed colored light.

BRIEF DESCRIPTION OF THE DRAWINGS

The parts shown in the figures are not necessarily true to scale; rather, the emphasis lies in presenting principles of the invention. Further, the same reference signs in the figures denote parts that correspond to one another. In the figures:

FIG. 3 schematically shows aspects of a light-producing assembly in exemplary fashion, where N=3 color types are provided, as per one or more embodiments;

FIG. 4 schematically shows aspects of another light-producing assembly in exemplary fashion, where N=4 color types are provided, as per one or more embodiments.

FIG. 6 schematically shows alternative profiles of bonding bridges of a light-producing assembly in exemplary fashion, as per one or more embodiments; and FIG. 7 schematically shows variants of a light-producing assembly in exemplary fashion, said variants being equipped with protective apparatuses, as per one or more embodiments.

DETAILED DESCRIPTION

The following detailed description refers to the attached drawings, which belong thereto and which show, by the elucidation of specific embodiments, how the invention can be implemented in practice.

In this context, directional terminology such as, e.g., "above", "below", "backward", "disposed in front of", "disposed behind", "disposed downstream", "disposed upstream", etc., can be used with reference to the alignment of the figures being described. Further, terms such as "in front of", "following" or "behind" may denote the arrangement of components in relation to the direction of the light beams. By way of example "following the lens" means an area facing the light emergence side of the lens. Since parts of embodiments can be positioned in a number of different alignments, the directional terminology can be used for elucidation purposes, but is by no means restrictive. Reference is made to the fact that other embodiments can be applied and structural or logical modifications can be carried out without departing from the scope of protection of the present invention. The following detailed description should therefore not be interpreted in a restrictive sense and the scope of protection of the present invention is defined by the attached claims.

Reference is now made in detail to various embodiments and to one or more examples, which are elucidated in the figures. Each example is presented in explanatory fashion and should not be interpreted as a restriction of the invention. By way of example, elucidated features or features described as part of one embodiment may be applied to, or in conjunction with, other embodiments in order to give rise to an even further embodiment. It is intended that the present invention comprises such modifications and variations. The examples are described using specific language, which should not be construed as restricting the scope of protection of the attached claims. The drawings are not reproduced true to scale and merely serve for elucidating purposes. If nothing else is specified, the same elements have been denoted by the same references in the various drawings for the purposes of a better understanding.

Figure 1:
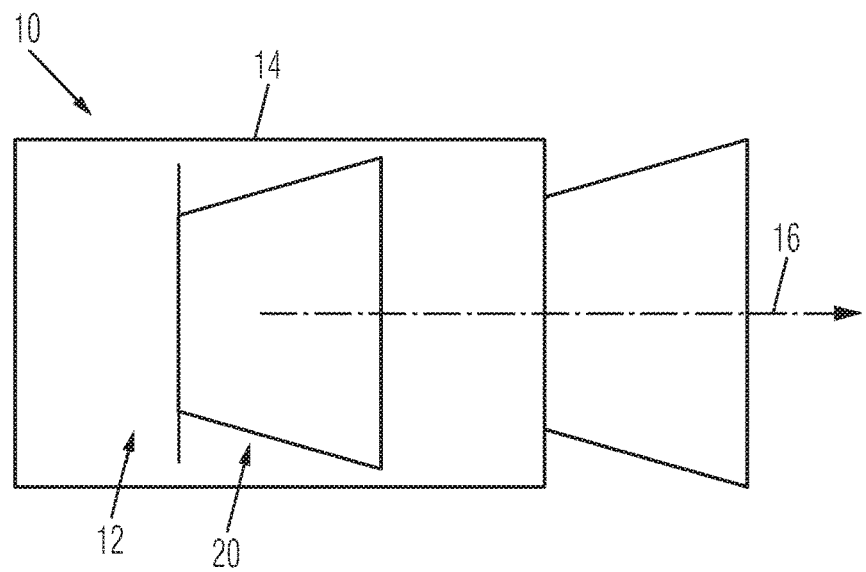
FIG. 1 schematically shows a spotlight in exemplary fashion, comprising a light-producing assembly according to one or more embodiments.

FIG. 1 shows a spotlight 10 with a light-producing assembly 12. The latter is arranged in the interior of a spotlight housing 14, for example.

The spotlight 10 can emit light along one direction 16.

The light-producing assembly 12 comprises an LED arrangement 18 (see FIG. 2) and an optical unit 20 coupled to the LED arrangement 18. The optical unit 20 is embodied as, for example, a conical or polygonal reflector, e.g., as a reflector with a hexagonal cross-sectional area. By way of example, the optical unit 20 is embodied as a singular collimation optical unit in the form of a collimation reflector 22.

The LED arrangement 18 further comprises a carrier 24 and a multiplicity of LEDs 26, only a few of which have been provided with reference signs.

The LEDs 26 are all positioned on a carrier front side 28 of the carrier 24. Here, a footprint side (e.g., solder side) of the LEDs 26 always faces the carrier front side 28.

Figure 5:
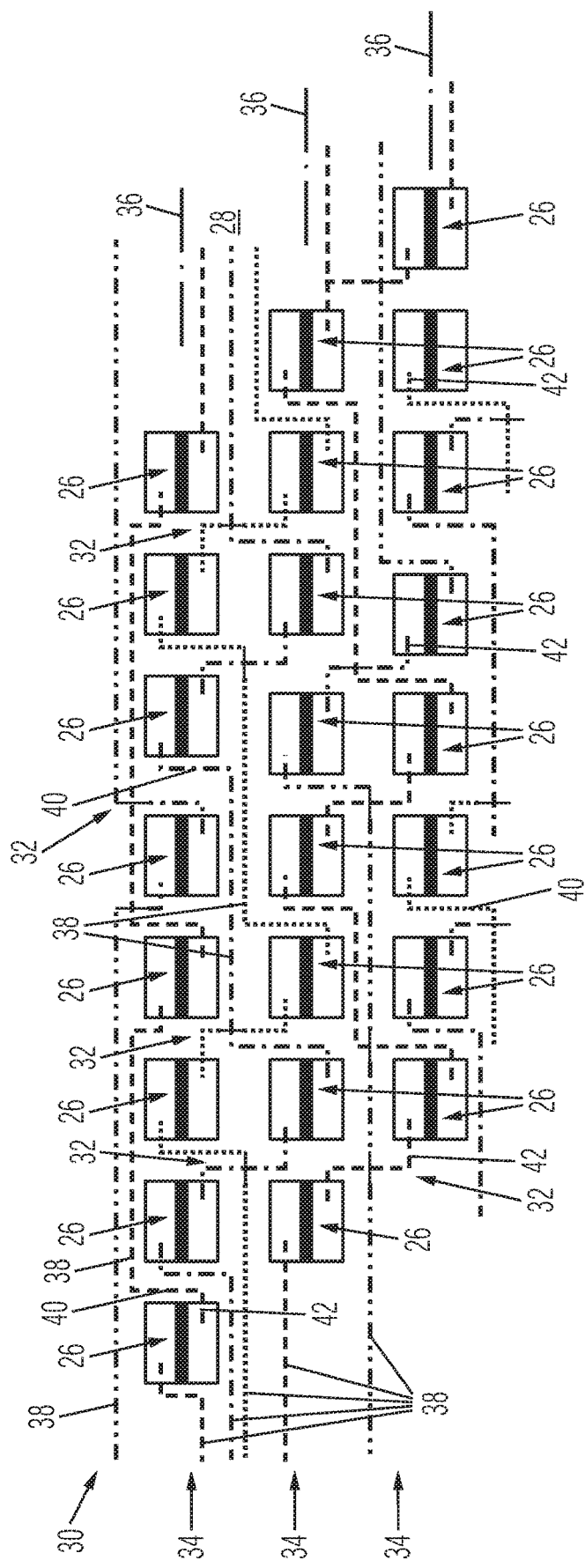
FIG. 5 schematically shows aspects of an additional light-producing assembly in exemplary fashion, where N=4 color types are provided, as per one or more embodiments.

The LEDs 26 comprise LEDs with N>2 different color types, wherein a multiplicity of LEDs are provided for each of the N color types (see FIGS. 3 to 5).

By way of example, N is 4 and the color types are white, red, green and blue.

In order to supply electrical power to the LEDs 26, the light-producing assembly 12 moreover comprises a line system 30, which is at least partly integrated into the carrier 24 (see FIGS. 3 to 5, in particular). Here, the line system has N line types, which each supply the LEDs 26 of the associated color type N in terms of power.

In the embodiments according to FIGS. 3 to 5, lines of different line types cross in crossing regions 32, with, once again, only some of the crossing regions 32 having been provided with reference signs. Here, in a vertical plan view of the carrier front side 28, the crossing regions 32 lie outside of a vertical projection surface of the footprint sides of the LEDs 26 on the carrier front side 28.

Moreover, the crossing lines extend above or below one another in a direction vertical to the carrier front side 28. Here, they are electrically insulated from one another, i.e., not connected. Both of the crossing lines may be integrated into the carrier 24 in the crossing region 32. Then, the carrier 24 has a multi-layer embodiment, at least in the crossing region 32. Additionally, the carrier 24 may have a single layer embodiment and one of the crossing lines may be embodied as a bonding bridge 33 (e.g., above and below the carrier 24). By way of example, the carrier 24 is embodied as an entirely single layer circuit board and bonding bridges are used (instead of multi-layer portions) for the purposes of forming the crossing regions.

Exemplary embodiments of bonding bridges 33 are illustrated in FIG. 6. Here, the bonding bridges 33a to 33d shown in this figure should be understood to be alternatives, which can be applied in any combination.

The bonding bridge 33a extends directly from one of the LEDs 26 to a main conductor track 38. In the process, it bridges over another main conductor track 38.

The bonding bridge 33b extends from an edge or corner of an LED 26 to a main conductor track 38 situated at the opposite edge or corner of the LED 26. In the process, the bonding bridge 33b bridges over both the LED 26 and a further main conductor track 38.

The bonding bridge 33c extends from one LED 26 to another LED 26. In the process, it bridges over a main conductor track 38.

The bonding bridge 33d is connected to main conductor tracks 38 on both sides and bridges over a further main conductor track 38.

As illustrated in FIGS. 3 to 5, all LEDs 26 are arranged according to a regular grid on the carrier front side 28. In this context, a multiplicity of grid tracks 34 that do not overlap and that are arranged at a transverse distance from one another are provided. Here, each grid track 34 comprises a multiplicity of grid holding areas, on which respectively one LED 26 is positionable. Here, the grid holding areas are arranged individually in succession along a trajectory 36 from a grid track entrance to a grid track exit.

All grid holding areas are occupied by LEDs 26 in the illustrated embodiments.

Here, at least one LED 26 of each of the N different color types is provided in each of at least 90% of all grid tracks 34. Here, the LEDs 26 of the different color types are positioned in any sequence.

Here, the value of at least 90% means that at least one LED 26 of each of the N different color types are respectively provided in practically all grid tracks 34. By way of example, grid tracks 34 extending along the edge or comprising only a few grid holding areas on account of geometric restrictions are excluded therefrom.

The line system 30 comprises main conductor tracks 38 extending along the trajectory 36 of the grid tracks 34, said main conductor tracks being without overlap both among themselves and with the grid tracks 34. Once again, only selected main conductor tracks 38 are provided with reference signs for reasons of a better overview.

The main conductor tracks 38 extend without crossing among themselves.

For electrical power supply purposes, each of the LEDs 26 is electrically connected by means of two connection tracks 40 to the main conductor track 38 that has been assigned in respect of the color type, in a direction transverse to the trajectory 36.

The connection tracks 40 in turn are respectively electrically connected to a contact section 42 of the associated LED 26. Here, the contact sections 42 extend substantially along the trajectory 36.

What emerges herefrom is that each of the crossing regions 32 is formed by a connection track 40 and a main conductor track 38, which are assigned to different color types in each case. Here, the main conductor track 38 forming the crossing region 32 is always arranged adjacently to a main conductor track 38 to which the connection track 40 forming the crossing region 32 is electrically connected.

In respect of the distances of the grid tracks 34 in a direction transverse to the trajectory 36, no more than N main conductor tracks 38 lie between two adjacent grid tracks 34, with the main conductor tracks 38 each having been assigned to different color types.

By way of example, this is the case in the embodiments according to FIGS. 3 and 4, in which three and four main conductor tracks 38, respectively, extend between adjacent grid tracks 34.

Alternatively, the line system 30 may comprise main conductor tracks 38, where no more than 0.5×N main conductor tracks 38 are present between adjacent grid tracks. Here, 0.5×N is rounded up to the next-highest integer. The main conductor tracks 38, which are adjacent on both sides in a direction transverse to the fictitious trajectory 36 of a grid track 34, are each assigned to different color types.

This can be seen in the exemplary embodiment according to FIG. 5. There, provision is made of N=4 different color types, with, however, only two main conductor tracks 38 being present between adjacent grid tracks 34.

In respect of the distance between grid holding areas adjacent along the trajectory 36, i.e. the LEDs 26, no more than two connection tracks 40 extend therebetween in all exemplary embodiments, with the connection tracks 40 in each case being assigned to those color types that correspond to the adjacent LEDs 26 along the trajectory 36.

Figure 2:
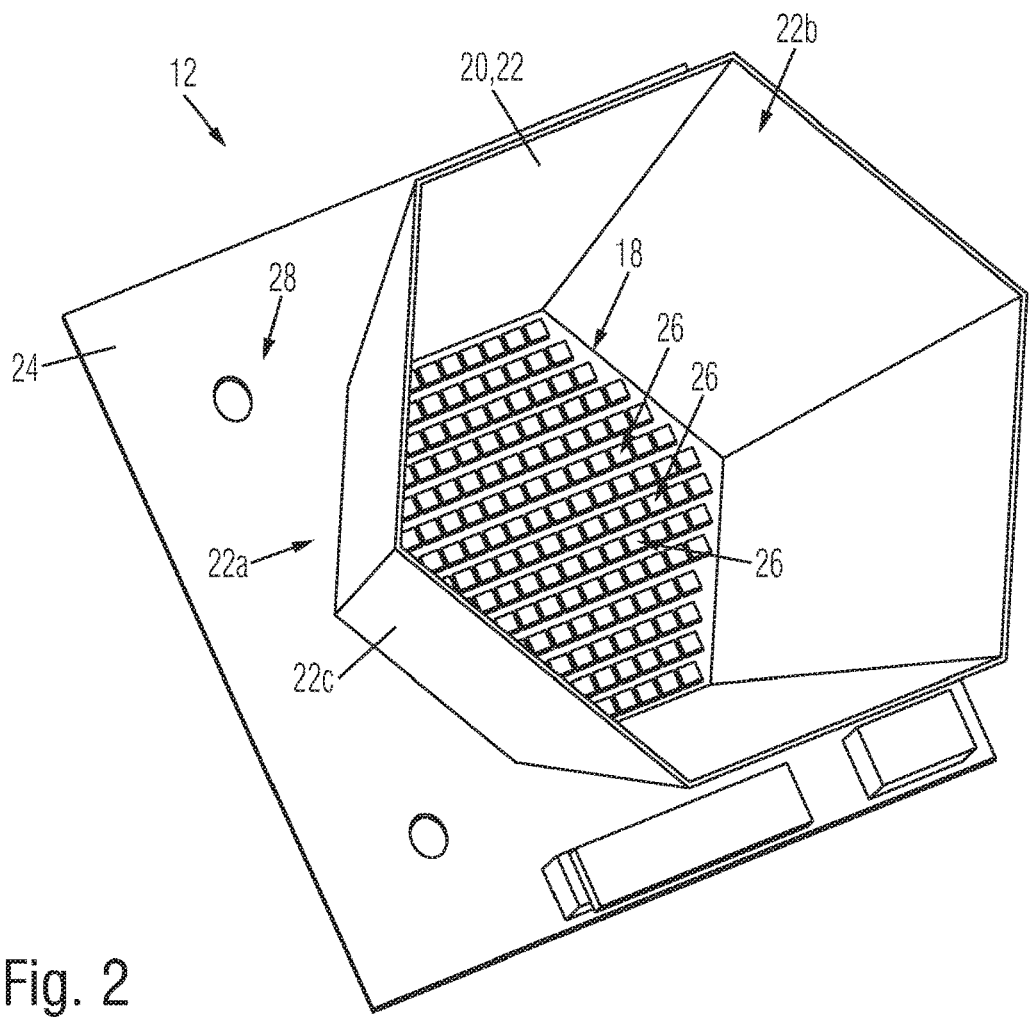
FIG. 2 schematically shows a light-producing assembly in exemplary fashion, as per one or more embodiments.

As is identifiable on the basis of FIG. 2 in particular, an envelope of the multiplicity of LEDs 26 forms a closed polygonal chain, which is a hexagon in the present case. Alternatively, this could also relate to a circle or an oval.

Accordingly, the optical unit 20 has a light entry opening 22a that is likewise hexagonal, i.e., that corresponds to the envelope in respect of its form. In respect of its size, too, the light entry opening 22a and the envelope correspond to one another.

The optical unit 20—e.g., the collimation reflector 22—further has a light emergence opening 22b, which is connected to the light entry opening 22a by way of an, e.g., tubular light-guiding section 22c. The inner side of the light-guiding section 22c is reflective. Moreover, the light emergence opening 22b covers a larger area than the light entry opening 22a. Thus, the optical unit 20 widens in the light emission direction.

Overall, the optical unit 20—e.g., the collimation reflector—consequently spans the totality of the LEDs 26 and is embodied to receive and output the light emanating from each of the LEDs 26.

In order to protect the light-producing assembly 12 and, in particular, the LED arrangement 18 from unwanted influences of the surroundings, i.e., for example, protect it against particles, liquids and/or gases penetrating therein, provision can be made of a protective apparatus 44.

According to the variant of FIG. 7a), the protective apparatus 44 can be a protective glass positioned on the light emergence side of the optical unit 20. Alternatively, a lens or diffuser can be provided at the same location (see FIG. 7b)).

It is also possible to provide a lens that acts as a protective apparatus 44 at the light entry side of the optical unit 20, as illustrated in FIG. 7c).

FIG. 7d) shows a variant in which the protective apparatus 44 comprises two lenses. Here, a converging lens is arranged on the light entry side of the optical unit 20 and an achromatic converging lens is arranged on the light emergence side.

According to one embodiment, the optical unit 20 is embodied as a conical or polygonal reflector, e.g., as a reflector with a hexagonal cross-sectional area, and the protective apparatus 44 acting as a diffuser, e.g., as a stochastic or holographic diffuser, is provided on the light emergence side of the optical unit 20. By way of example, the reflector can be either round or ellipsoid, or polygonal on its light entry and/or outer side. The light entry and emergence sides may have different diameters (perimeters), and so a reflector in the form of a truncated cone or a truncated pyramid may arise, for example.

The invention claimed is:

1. A light-producing assembly for a spotlight for illuminating film, studio, stage, event and/or theater surroundings, comprising
  a carrier, on which an LED arrangement with a multiplicity of LEDs is arranged, wherein the LEDs comprise LEDs with N>2 different color types and any number of LEDs is provided for each of the N color types, and wherein a footprint side of one of each of the LEDs faces a carrier front side, wherein the carrier is embodied as a single layer circuit board;
  a line system for supplying power to the LEDs, comprising a multiplicity of lines with N line types, wherein lines of different line types cross in crossing regions and the crossing regions lie outside of a vertical projection surface of the footprint sides on the carrier front side in a vertical plan view of the carrier front side; and
  an optical unit coupled to the LED arrangement, said optical unit spanning the totality of the LEDs and being embodied to receive and form the light emanating from each of the LEDs.

2. The assembly as claimed in claim 1, wherein the crossing lines extend one above the other in a direction vertical to a carrier front side and the crossing lines are integrated into the carrier in the respective crossing region or one of the crossing lines is embodied as a bonding bridge which spans the respective other crossing line.

3. The assembly as claimed in claim 2, wherein all LEDs are arranged according to a regular grid on the carrier front side, according to which:
  a multiplicity of grid tracks that do not overlap and that are arranged at a transverse distance from one another are provided on the carrier front side;
  each grid track comprises a multiplicity of grid holding areas, an LED being positionable therein in each case, wherein the grid holding areas are arranged individually in succession along a fictitious trajectory from the grid track entrance to the grid track exit;
  a protective apparatus acting as a diffuser, which is provided at a light emergence side of the optical unit and
  at least one LED of each of the N different color types is provided in each of at least 90% of all grid tracks, wherein the LEDs are arranged in any sequence within the grid tracks;
  wherein the optical unit is embodied as a conical or polygonal reflector,
  wherein the optical unit has a light entry opening and a light emergence opening, which are connected by way of a light-guiding section, wherein an inner side of the light-guiding section is reflective; and
  wherein, in a plan view of the carrier front side, an envelope of the multiplicity of LEDs is a closed polygonal chain, a circle or an oval, and an edge region of the light entry opening corresponds to the envelope in respect of its form and its size.

4. The assembly as claimed in claim 3, wherein the optical unit is embodied as a reflector with a hexagonal cross-sectional area.

5. The assembly as claimed in claim 4, further comprising a protective apparatus acting as a diffuser, wherein the diffuser is a stochastic diffuser, which is provided at a light emergence side of the optical unit.

6. The assembly as claimed in claim 4, further comprising a protective apparatus acting as a diffuser, wherein the diffuser is a holographic diffuser, which is provided at a light emergence side of the optical unit.

7. The assembly as claimed in claim 1, wherein all LEDs are arranged according to a regular grid on the carrier front side, according to which:
- a multiplicity of grid tracks that do not overlap and that are arranged at a transverse distance from one another are provided on the carrier front side;
- each grid track comprises a multiplicity of grid holding areas, an LED being positionable therein in each case, wherein the grid holding areas are arranged individually in succession along a fictitious trajectory from the grid track entrance to the grid track exit; and
- at least one LED of each of the N different color types is provided in each of at least 90% of all grid tracks, wherein the LEDs are arranged in any sequence within the grid tracks.

8. The assembly as claimed in claim 1, wherein the optical unit is embodied as a conical or polygonal reflector.

9. The assembly as claimed in claim 1, further comprising a protective apparatus acting as a diffuser, which is provided at a light emergence side of the optical unit.

10. The assembly as claimed in claim 1, wherein the optical unit is a singular collimation optical unit.

11. The assembly as claimed in claim 1, wherein the optical unit has a light entry opening and a light emergence opening, which are connected by way of a light-guiding section, wherein an inner side of the light-guiding section is reflective.

12. The assembly as claimed in claim 11, wherein, in a plan view of the carrier front side, an envelope of the multiplicity of LEDs is a closed polygonal chain, a circle or an oval, and an edge region of the light entry opening corresponds to the envelope in respect of its form and its size.

13. A spotlight comprising a light-producing assembly as claimed in claim 1.

14. The assembly as claimed in claim 1, wherein the optical unit is embodied as a reflector with a hexagonal cross-sectional area.

15. The assembly as claimed in claim 1, further comprising a protective apparatus acting as a diffuser, wherein the diffuser is a stochastic diffuser, which is provided at a light emergence side of the optical unit.

16. The assembly as claimed in claim 1, further comprising a protective apparatus acting as a diffuser, wherein the diffuser is a holographic diffuser, which is provided at a light emergence side of the optical unit.

* * * * *